(12) United States Patent
Chang et al.

(10) Patent No.: US 8,575,536 B2
(45) Date of Patent: Nov. 5, 2013

(54) PIXEL ARRAY AND TOUCH SENSING DISPLAY PANEL HAVING THE SAME

(75) Inventors: Yang-Hui Chang, Hsinchu County (TW); Shen-Tai Liaw, Hsinchu (TW); Sen-Shyong Fann, Taipei County (TW)

(73) Assignee: Integrated Digital Technologies Inc., Hsinchu (TW)

(*) Notice: Subject to any disclaimer, the term of this patent is extended or adjusted under 35 U.S.C. 154(b) by 117 days.

(21) Appl. No.: 12/954,682

(22) Filed: Nov. 26, 2010

(65) Prior Publication Data

US 2011/0090194 A1    Apr. 21, 2011

Related U.S. Application Data

(60) Continuation-in-part of application No. 12/406,337, filed on Mar. 18, 2009, now Pat. No. 7,935,917, which is a division of application No. 11/534,680, filed on Sep. 25, 2006, now Pat. No. 7,525,078.

(30) Foreign Application Priority Data

Oct. 7, 2005 (TW) ................................ 94135169 A (51) Int. Cl.
*G06M 7/00* (2006.01)
*H01J 40/14* (2006.01)

(52) U.S. Cl.
USPC ...................................... 250/221; 250/214 R (58) Field of Classification Search
USPC .......... 250/221, 214.1, 214 R, 208.1, 208.2; 349/12, 41–47; 257/59, 72; 345/173–175, 179–183, 92; 178/18.01, 178/18.05–19.05

See application file for complete search history.

(56) References Cited

U.S. PATENT DOCUMENTS

| 4,684,801 A | 8/1987 | Carroll et al. |
| 4,988,983 A | 1/1991 | Wehrer |
| 5,705,807 A | 1/1998 | Throngnumchai et al. |
| 6,046,466 A | 4/2000 | Ishida et al. |
| 6,350,981 B1 | 2/2002 | Uno |

(Continued)

FOREIGN PATENT DOCUMENTS

| EP | 0679869 | 11/1995 |
| EP | 1195576 | 6/2008 |

(Continued)

OTHER PUBLICATIONS

"Office Action of Korea Counterpart Application", issued on Jun. 24, 2013, with English translation thereof, p1-p8, in which the listed reference was cited.

*Primary Examiner* — Pascal M Bui Pho
(74) *Attorney, Agent, or Firm* — Jianq Chyun IP Office (57) ABSTRACT

A pixel array including a plurality of pixel structures is provided. At least one of the pixel structures has a scan line, a data line, an active device, a pixel electrode, a readout line, an electro-magnetic interference (EMI) shielding layer and a sensing device. The scan line and the data line are disposed on a substrate. The active device is electrically connected to the scan line and the data line. The pixel electrode is electrically connected to the active device. The readout line is disposed above or below a data line. The EMI shielding layer covers the data line, and is between the readout line and the data line. The sensing device is electrically connected to the scan line and the readout line.

17 Claims, 9 Drawing Sheets

(56) References Cited

U.S. PATENT DOCUMENTS

| | | |
|---|---|---|
| 6,512,547 B1 | 1/2003 | Miida |
| 6,947,102 B2 | 9/2005 | den Boer et al. |
| 7,002,547 B2 | 2/2006 | Yamada |
| 7,145,619 B2 | 12/2006 | Sawasaki et al. |
| 7,298,431 B2 | 11/2007 | Yang et al. |
| 7,298,437 B2 | 11/2007 | Edwards et al. |
| 7,420,213 B2 | 9/2008 | Chae et al. |
| 7,741,646 B2 * | 6/2010 | Kang et al. ............... 257/72 |
| 7,812,906 B2 * | 10/2010 | Eguchi ..................... 349/116 |
| 8,111,344 B2 * | 2/2012 | Moon et al. .............. 349/48 |
| 2003/0156230 A1 | 8/2003 | Boer et al. |
| 2003/0218116 A1 | 11/2003 | Boer |
| 2005/0200296 A1 | 9/2005 | Naugler, Jr. et al. |
| 2006/0187368 A1 | 8/2006 | Kim et al. |
| 2007/0103634 A1 | 5/2007 | Kim et al. |
| 2008/0030636 A1 | 2/2008 | Huang et al. |
| 2008/0218677 A1 | 9/2008 | Kume et al. |
| 2009/0195718 A1 | 8/2009 | He et al. |
| 2010/0164884 A1 * | 7/2010 | Chiu et al. ............... 345/173 |

FOREIGN PATENT DOCUMENTS

| | | |
|---|---|---|
| JP | 4013360 | 1/1992 |
| JP | 06-011645 | 1/1994 |
| JP | 2000-162041 | 6/2000 |
| KR | 2001-0004005 | 1/2001 |

\* cited by examiner

PIXEL ARRAY AND TOUCH SENSING DISPLAY PANEL HAVING THE SAME

CROSS-REFERENCE TO RELATED APPLICATION

This application is a continuation in part (CIP) application of and claims the priority benefit of patent application Ser. No. 12/406,337, filed on Mar. 18, 2009. The prior patent application Ser. No. 12/406,337 is a divisional application of and claims the priority benefit of patent application Ser. No. 11/534,680, filed on Sep. 25, 2006, which has been patented as U.S. Pat. No. 7,525,078 on Apr. 28, 2009. The prior patent application Ser. No. 11/534,680 also claims the priority benefit of Taiwan application No. 94135169, filed on Oct. 7, 2005. The entirety of each of the above-mentioned applications is hereby incorporated by reference herein and made a part of this specification.

BACKGROUND OF THE INVENTION

1. Field of the Invention

The present invention relates to a pixel array and a display panel having the same. More particularly, the present invention relates to a touch sensing display panel and its pixel array.

2. Description of Related Art

In current information era, human beings by degrees tend to rely on electronic products. The electronic products such as mobile phones, handheld personal computers (PCs), personal digital assistants (PDAs) and smart phones have pervaded everywhere in our daily life. To meet current demands on portable, compact, and user-friendly information technology (IT) products, touch sensing display panels have been introduced as input devices in replacement of conventional keyboards or mice. Among the touch sensing display panels, a touch sensing display panel capable of performing both a touch function and a display function is one of the most popular products at present.

Generally speaking, the touch sensing display panels are divided into built-in touch sensing display panels and added-type touch sensing display panels. The built-in touch sensing display panel is in a form of building touch sensing devices in a display panel, while the added-type touch sensing display panel is in a form of attaching a touch sensing panel on a display panel. Because the built-in touch sensing display panels have advantage of thinness and lightness, it has been widely developed in recently years.

In the conventional built-in touch sensing display panels, a plurality of readout lines and sensing devices are formed in pixel structures. These readout lines and sensing devices are made of metals, and thus the aperture ratio of the pixel structures is reduced. Thereby, the brightness of the display panels using said pixel structures may be lower, so as to affect the display quality.

SUMMARY OF THE INVENTION

Accordingly, the present invention is directed to a pixel array and a display panel having the same capable of increasing the aperture ratio of the pixel structures of a built-in touch sensing display panel.

In the present invention, a pixel array including a plurality of pixel structures is provided. The pixel structures is surrounding by two adjacent scan lines and two adjacent data lines, and disposed on a substrate. And the pixel structure has an active device, a sensing device, a pixel electrode, and a readout line. The active device is electrically connected to one scan line and one data line. The pixel electrode is electrically connected to the active device. The sensing device is electrically connected to next scan line and the readout line, and the readout line is overlapped with the data line. The EMI shielding layer covers the data line, and is between the readout line and the data line.

The present invention also provides a display panel comprising a first substrate, a second substrate and a display medium disposed between the first substrate and the second substrate. The first substrate has a plurality of scan lines and a plurality of data lines disposed thereon, and comprises a plurality of active devices disposed near the intersection of the scan line and the data line. The active device is electrically connected to one scan line and one data line, and driven by the scan line. The pixel electrode is electrically connected to the active device. The readout line is disposed parallel with the data line and disposed by another process different from the data line. The EMI shielding layer covers the data line and is between the readout line and the data line. The sensing device is electrically connected to the scan line and the readout line.

In light of the foregoing, because the readout line is disposed above or below the data line, the aperture ratio of the pixel structure is increased. In addition, since the EMI shielding layer is between the readout line and the data line, the sensing signal on the readout line is not interfered by the driving signal on the data line underneath.

In order to make the aforementioned and other features and advantages of the present invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1:
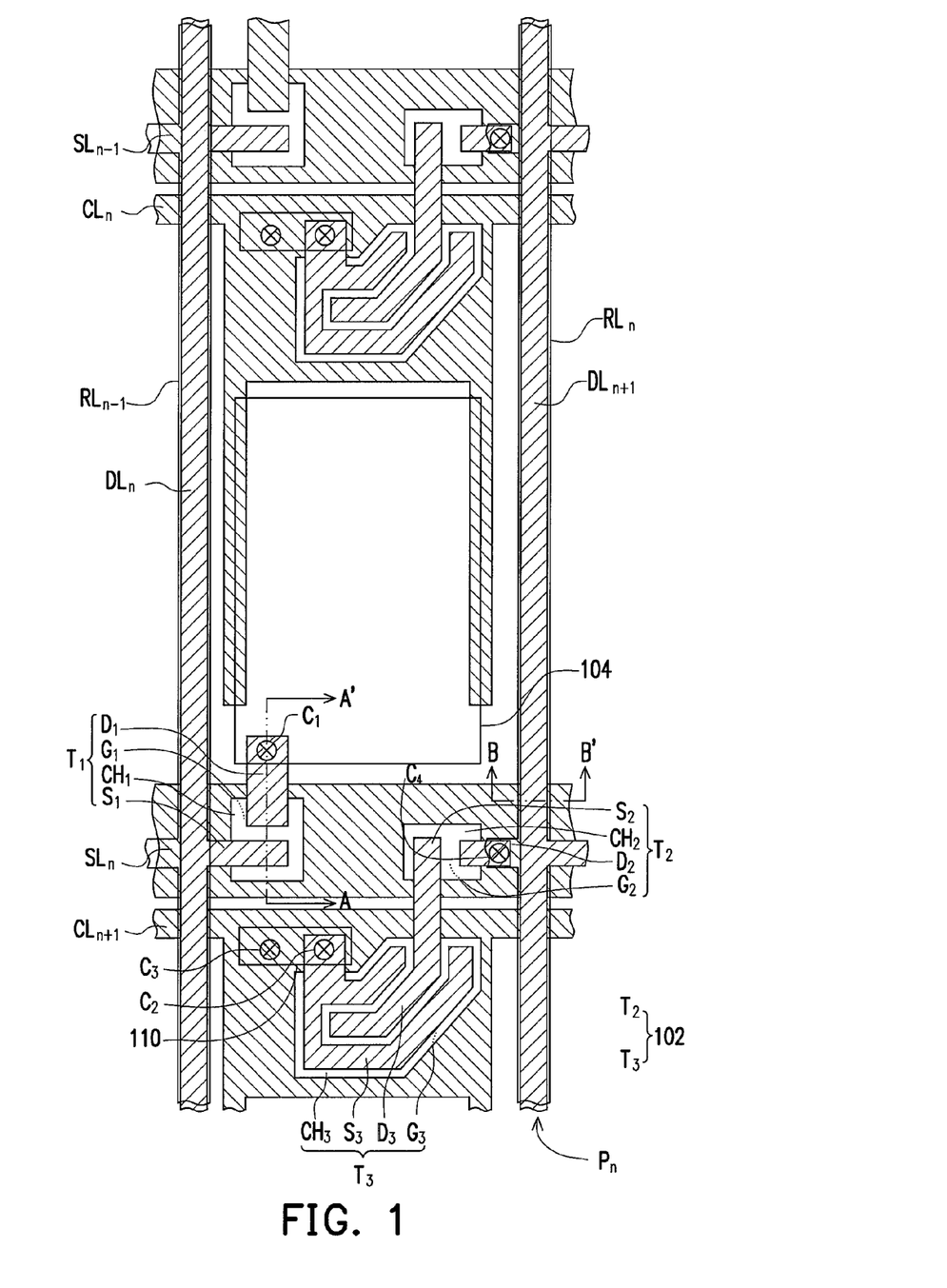
FIG. 1 is a schematic top view of a pixel structure of a pixel array according to an embodiment of the present invention.
Figure 3A:
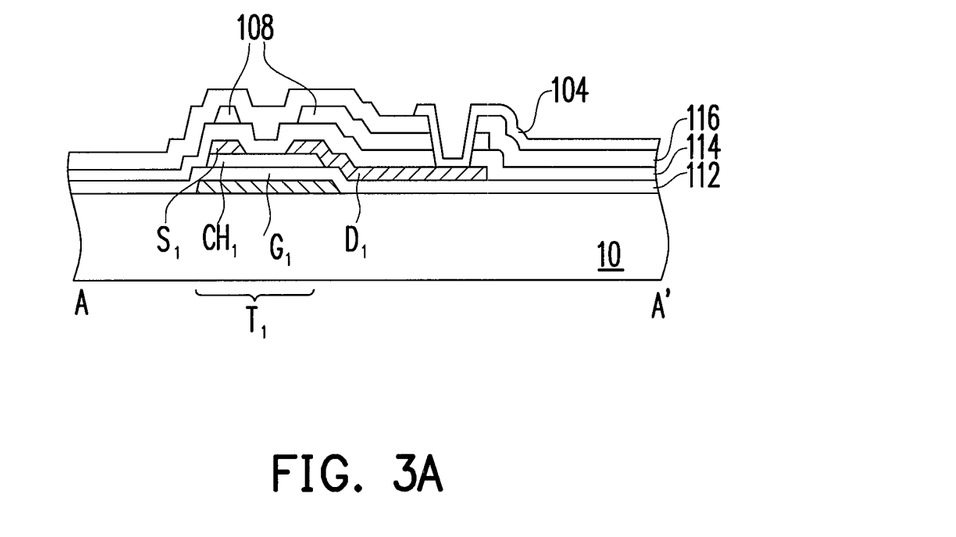
FIG. 3A is a schematic cross-sectional view along the cross-section line A-A' in FIG. 1.
Figure 3B:
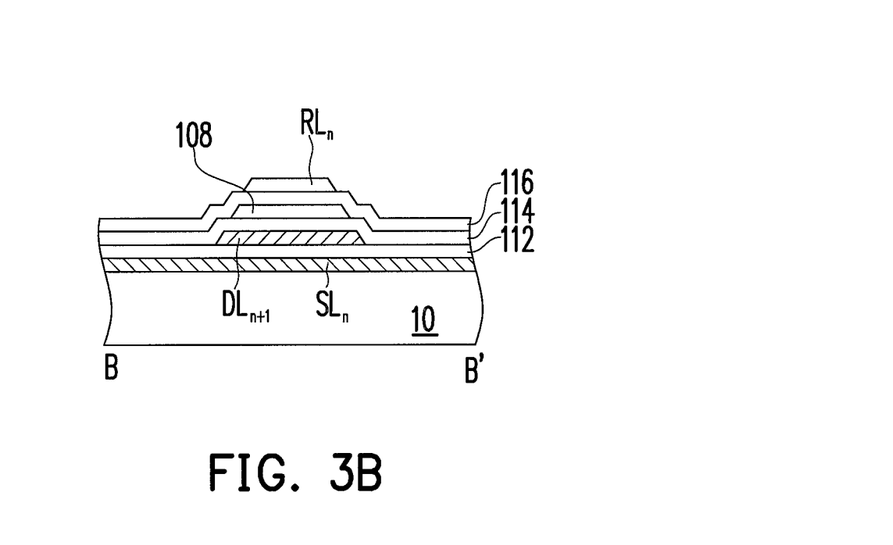
FIG. 3B is a schematic cross-sectional view along the cross-section line B-B' in FIG. 1.

FIG. 1 is a schematic top view of a pixel structure of a pixel array according to an embodiment of the present invention, FIG. 3A is a schematic cross-sectional view along the cross-section line A-A' in FIG. 1, and FIG. 3B is a schematic cross-sectional view along the cross-section line B-B' in FIG. 1. The pixel array of the embodiment comprises a plurality of pixel structures, and one pixel structure $P_n$ of the pixel array is shown in FIG. 1 for illustration. Referring to FIGS. 1, 3A and 3B, the pixel structures $P_n$ includes a scan line $SL_n$, a data line $DL_n$, an active device $T_1$, a pixel electrode 104, a readout line $RL_n$, an electro-magnetic interference (EMI) shielding layer 108 and a sensing device 102. According to the embodiment of the present invention, the pixel array comprises a plurality of scan lines ($SL_1, \ldots, SL_{n-1}, SL_n, SL_{n+1} \ldots$), a plurality of data lines ($DL_1, \ldots, DL_{n-1}, DL_n, DL_{n+1} \ldots$) and a plurality of readout lines ($RL_1, \ldots, RL_{n-1}, RL_n, RL_{n+1} \ldots$). Each pixel structure $P_n$ has one active device $T_1$, one pixel electrode 104, one sensing device 102 and an EMI shielding layer 108. However, the present invention does not limit to this embodiment and does not limit the number of the active device $T_1$, the number of the pixel electrode 104 and the number of the sensing device 102. According to another embodiment (not shown), each pixel structure may have the active device and the pixel electrode, and the sensing devices are only disposed in parts of the pixel structures. Moreover, in the embodiment, the pixel structure $P_n$ further comprises a capacitor electrode line $CL_n$. That means, the pixel array further comprises a plurality of capacitor electrode lines ($CL_1, \ldots, CL_{n-1}, CL_n, CL_{n+1} \ldots$).

The scan line $SL_n$ and the data line $DL_n$ are disposed on a substrate 10. The scan line $SL_n$ has an extending direction different from that of the data line $DL_n$. In addition, the scan line $SL_n$ and the data line $DL_n$ are disposed in different film layers, and an insulating layer 112 is sandwiched therebetween so as to electrically isolate the scan line $SL_n$ and the data line $DL_n$. The scan line $SL_n$ and the data line $DL_n$ are used to transmit the driving signals for the pixel structure $P_n$.

The active device $T_1$ of the pixel structure $P_n$ is electrically connected to the scan line $SL_n$ and the data line $DL_n$. Herein, the active device $T_1$ is a thin film transistor comprising a gate $G_1$, a channel $CH_1$, a source $S_1$ and a drain $D_1$. The gate $G_1$ is electrically connected to the scan line $SL_n$, the source $S_1$ is electrically connected to the data line $DL_n$. The channel $CH_1$ is disposed above the gate $G_1$ and under the source $S_1$ and the drain $D_1$. In addition, the gate $G_1$ is covered by the insulating layer 112, and the insulating layer 112 is between the gate $G_1$ and the channel $CH_1$, referring to FIG. 3A. In the embodiment, the active device $T_1$ is a bottom gate thin film transistor for illustration, but it is not limited in the present invention. According to the present embodiment, the active device $T_1$ is, for example, a top-gate thin film transistor.

The pixel electrode 104 is electrically connected to the active device $T_1$. In the embodiment, the pixel electrode 104 is electrically connected to the drain $D_1$ of the active device $T_1$ through a contact hole $C_1$ which is formed at an overlapping region between the drain $D_1$ and the pixel electrode 104. The pixel electrode 104 is made of a transparent conductive material, such as Indium Tin Oxide (ITO) or Indium Zinc Oxide (IZO), or a reflective conductive material, such as a metal. The pixel electrode 104 may also be formed by a combination of a transparent conductive material and a reflective conductive material (not shown), so as to form a transflective pixel structure.

In one embodiment, the readout line $RL_n$ is over a data line $DL_{n+1}$, abbreviated as ROD method. More specifically, the readout line $RL_n$ is directly disposed above the data line $DL_{n+1}$, and thereby the readout line $RL_n$ overlaps with the data line $DL_{n+1}$. In another embodiment, the data line $DL_{n+1}$ is over a readout line $RL_n$, abbreviated as DOR method. More specifically, the readout line $RL_n$ is directly disposed below the data line $DL_{n+1}$, and thereby the readout line $RL_n$ overlaps with the data line $DL_{n+1}$. The readout line $RL_n$ and the data line $DL_{n+1}$ may have the same line width or have different line widths. If the readout line $RL_n$ and the data line $DL_{n+1}$ have the same line width, the readout line $RL_n$ completely overlaps with the data line $DL_{n+1}$. If the readout line $RL_n$ and the data line $DL_{n+1}$ have different line widths, the line width of the readout line $RL_n$ is larger or smaller than the line width of the data line $DL_{n+1}$. Taking the ROD method for example, the readout line $RL_n$ and the pixel electrode 104 are in the same layer. That means, the readout line $RL_n$ and the pixel electrode 104 may be made at the same time and have the same material. In addition, the readout line $RL_n$ may have an extending direction different form that of the scan line $SL_n$, and the insulating layers 114 and 116 are formed between the readout line $RL_n$ and the scan line $SL_n$, referring to FIG. 3B.

The capacitor electrode line $CL_n$ is disposed on the substrate 10 and electrically couples with the pixel electrode 104. More specifically, the capacitor electrode line $CL_n$ is disposed under the pixel electrode 104, and the insulating layers 112, 114, and 116 are between the capacitor electrode line $CL_n$ and the pixel electrode 104. However, the capacitor electrode line $CL_n$ and the pixel electrode 104 have an overlapping region, and the capacitor electrode line $CL_n$ electrically couples with the pixel electrode 104 at this overlapping region. Hence, the electric charges of the pixel electrode 104 can be stored therein, so as to form a storage capacitor of the pixel structure $P_n$. In this embodiment, the capacitor electrode line $CL_n$ includes a main part and two branches extending from the main part, the main part has an extending direction parallel to the scan line $SL_n$, and the two branches have an extending direction parallel to the data line $DL_n$. However, the present invention does not limit the shape or layout of the capacitor electrode line $CL_n$. Moreover, in the embodiment, the capacitor electrode line $CL_n$ and the scan line $SL_n$ are formed simultaneously, and thus the capacitor electrode line $CL_n$ and the scan line $SL_n$ are in the same layer, referring to FIG. 2A. According to an embodiment, capacitor electrode lines ($CL_1, \ldots, CL_{n-1}, CL_n, CL_{n+1} \ldots$) in the pixel structures are electrically connected to a common voltage. The common voltage may be a direct current voltage, for example.

The sensing device 102 is electrically connected to the scan line $SL_n$ and the readout line $RL_n$. According to the embodiment, the sensing device 102 comprises a switch device $T_2$ and a photo sensor device $T_3$. The switch device $T_2$ is electrically connected to the scan line $SL_n$ and the readout line $RL_n$, while the photo sensor device $T_3$ is electrically connected to the switch device $T_2$. More specifically, the switch device $T_2$ comprises a gate $G_2$, a channel $CH_2$, a source $S_2$ and a drain $D_2$, and the photo sensor device $T_3$ comprises a gate $G_3$, a channel $CH_3$, a source $S_3$ and a drain $D_3$. In the switch device $T_2$, the channel $CH_2$ is disposed above the gate $G_2$ and under the source $S_2$ and the drain $D_2$. In the photo sensor device $T_3$, the channel $CH_3$ is disposed above the gate $G_3$ and under the source $S_3$ and the drain $D_3$. The gate $G_2$ of the switch device $T_2$ is electrically connected to the scan line $SL_n$, the source $S_2$ of the switch device $T_2$ is electrically connected to the drain $D_3$ of the photo sensor device $T_3$, the drain $D_2$ of the switch device $T_2$ is electrically connected to the readout line $RL_n$ through the contact window $C_4$, and the gate $G_3$ and the source $S_3$ of the photo sensor device $T_3$ are connected to the capacitor electrode line $CL_{n+1}$. In particular, the source $S_3$ of the photo sensor device $T_3$ is connected to the capacitor electrode line $CL_{n+1}$ through the conductive pattern 110 and the contact windows $C_2$ and $C_3$. In the embodiment, the switch device $T_2$ and the photo sensor device $T_3$ are respectively a bottom gate thin film transistor for illustration, but it is not limited in the present invention. According to the present embodiment, the switch device $T_2$ and the photo sensor device $T_3$ may respectively be a top-gate thin film transistor, for example. Skilled persons in the art will understand that the drain and the source of a thin film transistor may be exchangeable, depending on the voltage levels to which they are connected.

The EMI shielding layer 108 (shown in FIG. 3A and FIG. 3B) covers the data line $DL_{n+1}$, and is also disposed between the readout line $RL_n$ and the data line $DL_{n+1}$. In FIG. 1, the EMI shielding layer 108 is not shown, and the layout or arrangement of the EMI shielding layer 108 is illustrated in the subsequent description. According to the embodiment, the EMI shielding layer 108 overlaps with the data line $DL_n$ and $DL_{n+1}$, and the readout line $RL_n$ overlaps with the EMI shielding layer 108. The material of the EMI shielding layer 108 comprises a transparent conductive material, such as Indium Tin Oxide (ITO) or Indium Zinc Oxide (IZO), or a metal.

Accordingly, because the readout line and the data line are overlapped, the aperture ratio of the pixel structure $P_n$ is increased. Therefore, the brightness of the display panel having said pixel structures is increased so as to improve the display quality. In the meantime, since the EMI shielding layer 108 is between the readout line and the data line, the sensing signal on the readout line is not interfered by the driving signal on the data line underneath. Conventionally, the data line on the lower substrate usually has RC delay due to the capacitance between the data lines and the electrode layer on the upper substrate. In the display panel of the present embodiment, the EMI shielding layer is sandwiched between the data line and the readout line, resulted in reducing RC delay of the data line. For details, as shown in FIG. 3A, the contact window $C_1$ is formed in the insulating layers 114 and 116 and the EMI shielding layer 108, such that the EMI shielding layer 108 is electrically connected to the pixel electrode 104 and the drain $D_1$. That is, the EMI shielding layer 108 has an electric potential the same to that of the pixel electrode 104 and the drain $D_1$, so as to avoid the electromagnetic interference on the data line $DL_{n+1}$ affecting the readout line $RL_n$.

Figure 2A:
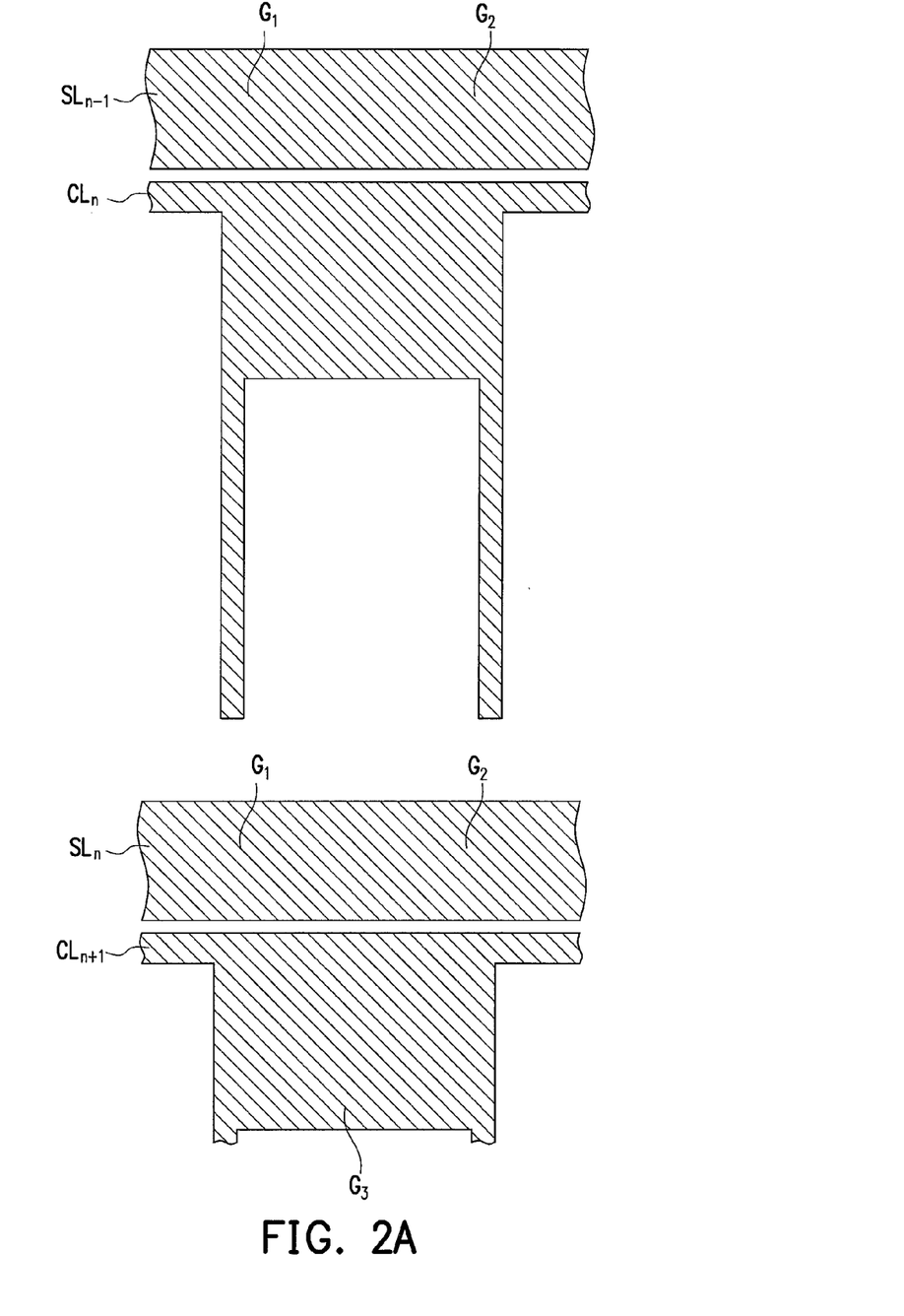
FIG. 2A is a schematic top view of a first metal layer of the pixel structure in FIG. 1.

In order to clearly describe the arrangement of the film layers in the pixel structure $P_n$, FIG. 2A~FIG. 2E respectively show top views of five film layers in the pixel structure $P_n$. FIG. 2A is a schematic top view of a first metal layer (also called M1) of the pixel structure $P_n$ in FIG. 1. Referring to FIG. 1 and FIG. 2A, the first metal layer comprises the scan line $SL_n$ and the capacitor electrode lines $CL_n$ and $CL_{n+1}$. In particular, a portion of the scan line $SL_n$ serves as the gate $G_1$ of the active device $T_1$ and residual portion of the scan line $SL_n$ serves as the gate $G_2$ of the switch device $T_2$. According to the embodiment, the elements shown in FIG. 2A are formed by a first photo-mask process, and thus these elements shown in FIG. 2A are formed at the same time and in the same layer. After the first metal layer shown in FIG. 2A is formed, the insulating layer 112 (shown in FIG. 3A and FIG. 3B) is formed to cover the first metal layer.

Figure 2B:
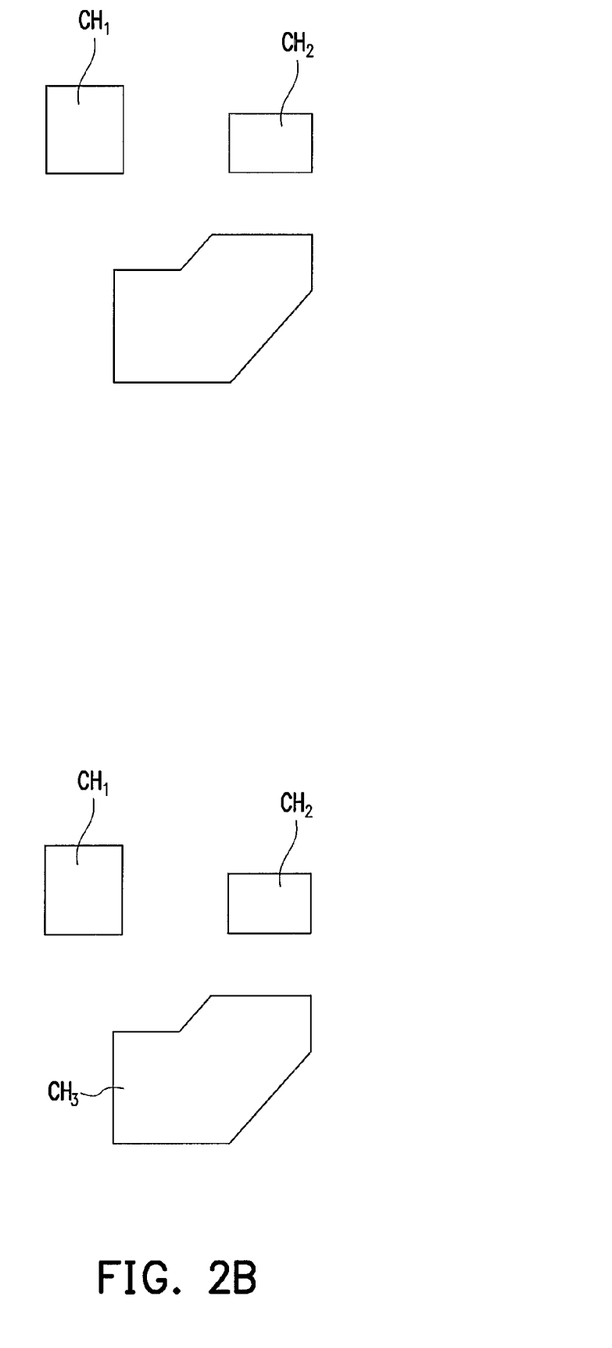
FIG. 2B is a schematic top view of a semiconductor layer of the pixel structure in FIG. 1.

FIG. 2B is a schematic top view of a semiconductor layer of the pixel structure $P_n$, in FIG. 1. Referring to FIG. 1 and FIG. 2B, the semiconductor layer is formed on the insulating layer 112 and comprises the channel $CH_1$ of the active device $T_1$, the channel $CH_2$ of the switch device $T_2$ and the channel $CH_3$ of the photo sensor device $T_3$. The semiconductor layer may be formed by an amorphous silicon layer and a doped amorphous silicon layer. According to the embodiment, the elements shown in FIG. 2B are formed by a second photo-mask process, and thus these elements shown in FIG. 2B are formed at the same time and in the same layer. In addition to the channel $CH_1$ of the active device $T_1$, the channel $CH_2$ of the switch device $T_2$ and the channel $CH_3$ of the photo sensor device $T_3$, the semiconductor layer may also comprises several interlayer patterns (not shown) between the capacitor electrode line and the data line and/or between the scan line and the data line according to another embodiment of the present invention.

Figure 2C:
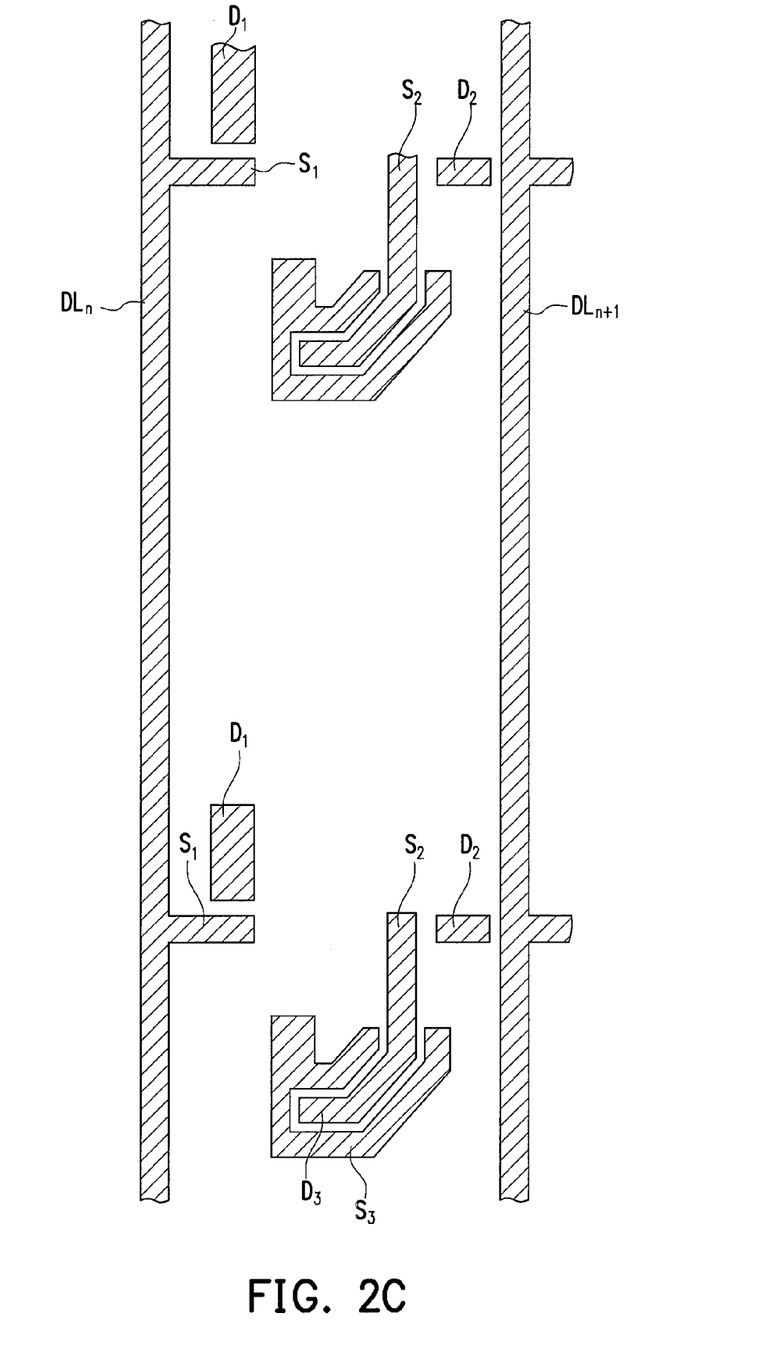
FIG. 2C is a schematic top view of a second metal layer of the pixel structure in FIG. 1.

FIG. 2C is a schematic top view of a second metal layer (also called M2) of the pixel structure $P_n$ in FIG. 1. Referring to FIG. 1 and FIG. 2C, the second metal layer comprises the data lines $DL_n$ and $DL_{n+1}$, the source $S_1$ and the drain $D_1$ of the active device $T_1$, the source $S_2$ and the drain $D_2$ of the switch device $T_2$ and the source $S_3$ and the drain $D_3$ of the photo sensor device $T_3$. According to the embodiment, the elements shown in FIG. 2C are formed by a third photo-mask process, and thus these elements shown in FIG. 2C are formed at the same time and in the same layer. After the second metal layer shown in FIG. 2C is formed, the insulating layer 114 (shown in FIG. 3A and FIG. 3B) serving as a protective layer is formed to cover the second metal layer.

Figure 2D:
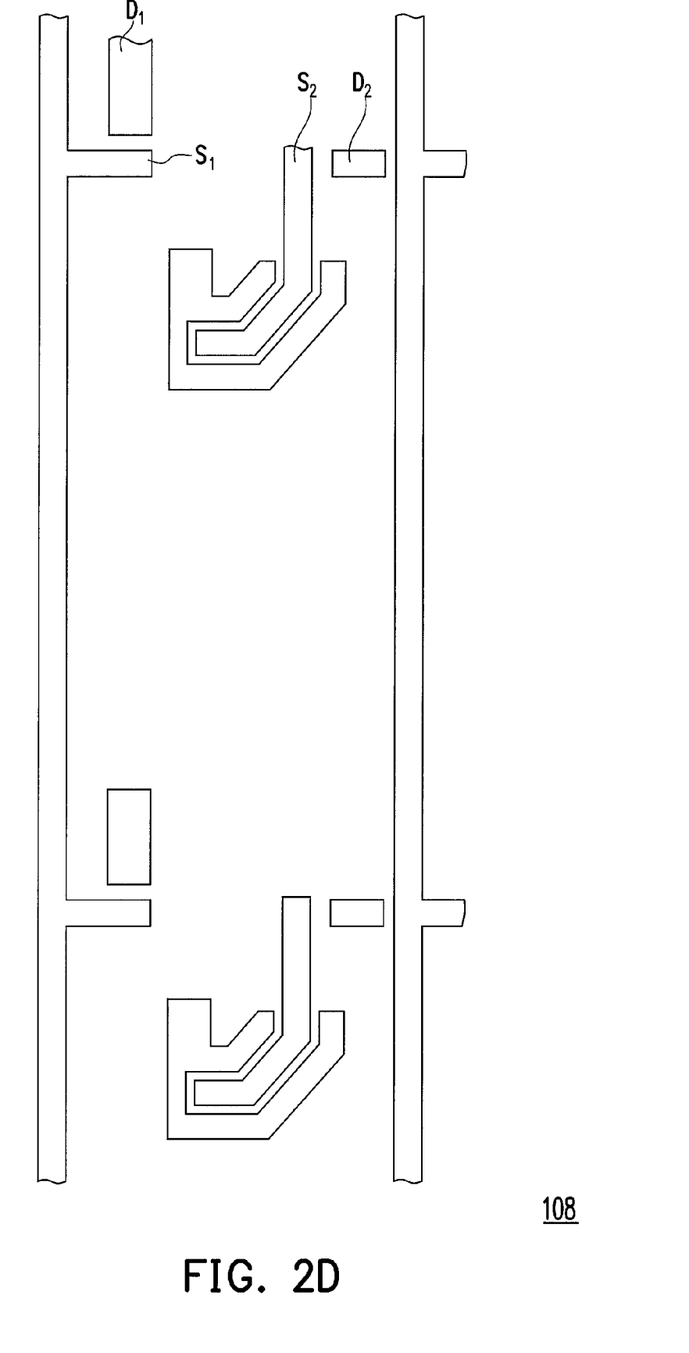
FIG. 2D is a schematic top view of an EMI shielding layer of the pixel structure in FIG. 1.

FIG. 2D is a schematic top view of an EMI shielding layer of the pixel structure $P_n$ in FIG. 1. Referring to FIG. 2C, FIG. 3A and FIG. 3B, the EMI shielding layer 108 is formed by the third photo-mask process which is used to form the second metal layer of FIG. 2C, and thereby the EMI shielding layer 108 has a pattern profile the same to that of the second metal layer of FIG. 2C. The EMI shielding layer 108 is made by a transparent conductive material or a metal.

After the EMI shielding layer 108 shown in FIG. 2D is formed, the insulating layer 116 (shown in FIG. 3A and FIG. 3B) serving as a protective layer is formed to cover the EMI shielding layer 108. Next, the insulating layers 116, 114 and the EMI shielding layer 108 is patterned by a fourth photo-mask process to form the contact openings for the contact windows $C_1$~$C_4$.

Figure 2E:
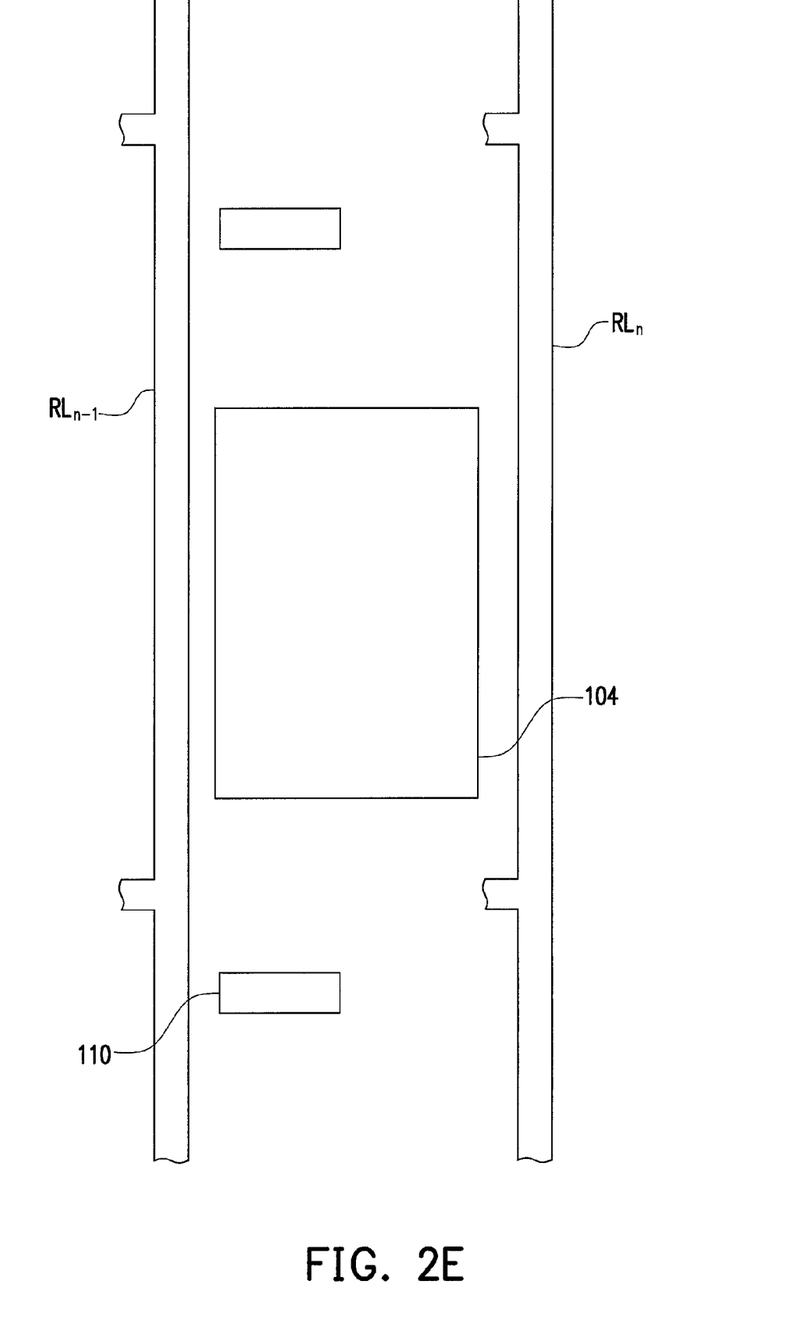
FIG. 2E is a schematic top view of a conductive layer of the pixel structure in FIG. 1.

FIG. 2E is a schematic top view of a conductive layer of the pixel structure $P_n$ in FIG. 1. Referring to FIG. 1 and FIG. 2E, the conductive layer comprises the readout lines and $RL_n$ and $RL_{n-1}$, the pixel electrode 104 and the conductive pattern 110. According to the embodiment, the elements shown in FIG. 2E are formed by a fifth photo-mask process, and thus these elements shown in FIG. 2E are formed at the same time and in the same layer.

Figure 4:
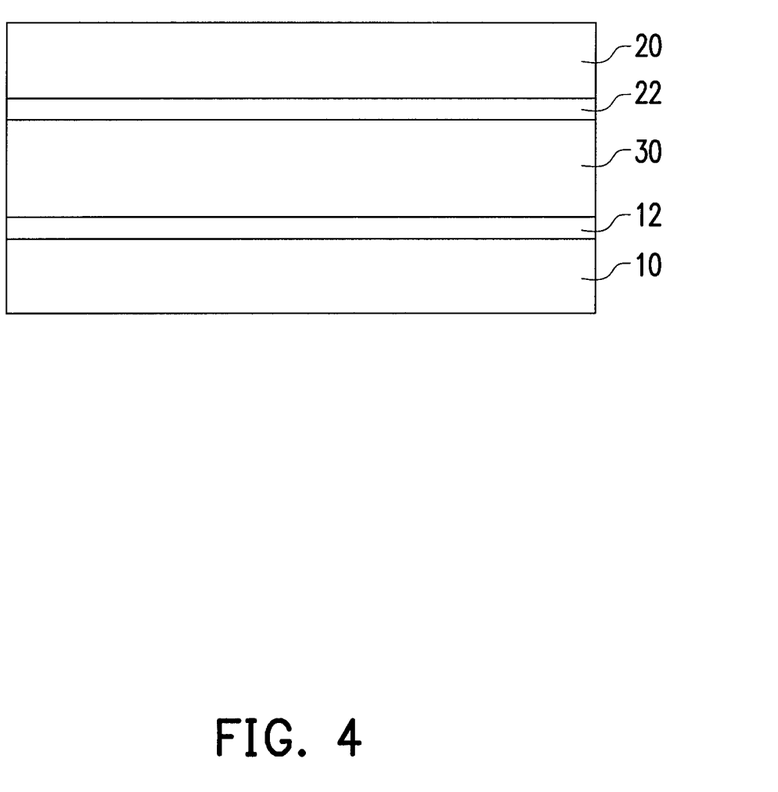
FIG. 4 is a schematic cross-sectional view of a display panel according to an embodiment of the present invention.

FIG. 4 is a schematic cross-sectional view of a display panel according to an embodiment of the present invention. Referring to FIG. 4, the display panel of the embodiment comprises a first substrate 10, a second substrate 20 and a display medium 30 disposed between the first substrate 10 and the second substrate 20.

The first substrate 10 can be made of glass, quartz, an organic material or a metal. The first substrate 10 has a pixel array 12 thereon, and the pixel array 12 may be the pixel array as shown in FIG. 1.

The second substrate 20 can be made of glass, quartz, an organic material or the like. In the embodiment, the second substrate 20 has an electrode layer 22 disposed thereon. The electrode layer 22 can be a transparent electrode layer and can be, for example, made of indium tin oxide (ITO) or indium zinc oxide (IZO). The electrode layer 22 completely covers the second substrate 20 and is electrically connected to a common voltage, such as a direct current voltage. In addition, according to another embodiment, a color filter layer (not shown), which comprises red, green and blue filter patterns, can also be disposed on the second substrate 20. Moreover, a light shielding pattern layer (not shown) may also be disposed on the second substrate 20 and disposed between the patterns of the color filter array, and it is also called a black matrix.

In the embodiment, the display medium 30 disposed between the first substrate 10 and the second substrate 20 comprises a liquid crystal material. However, the present invention does not limit herein. The display medium 30 may also be other display materials, such as an organic light emitting material, an electrophoretic display material or a plasma display material.

Figure 5:
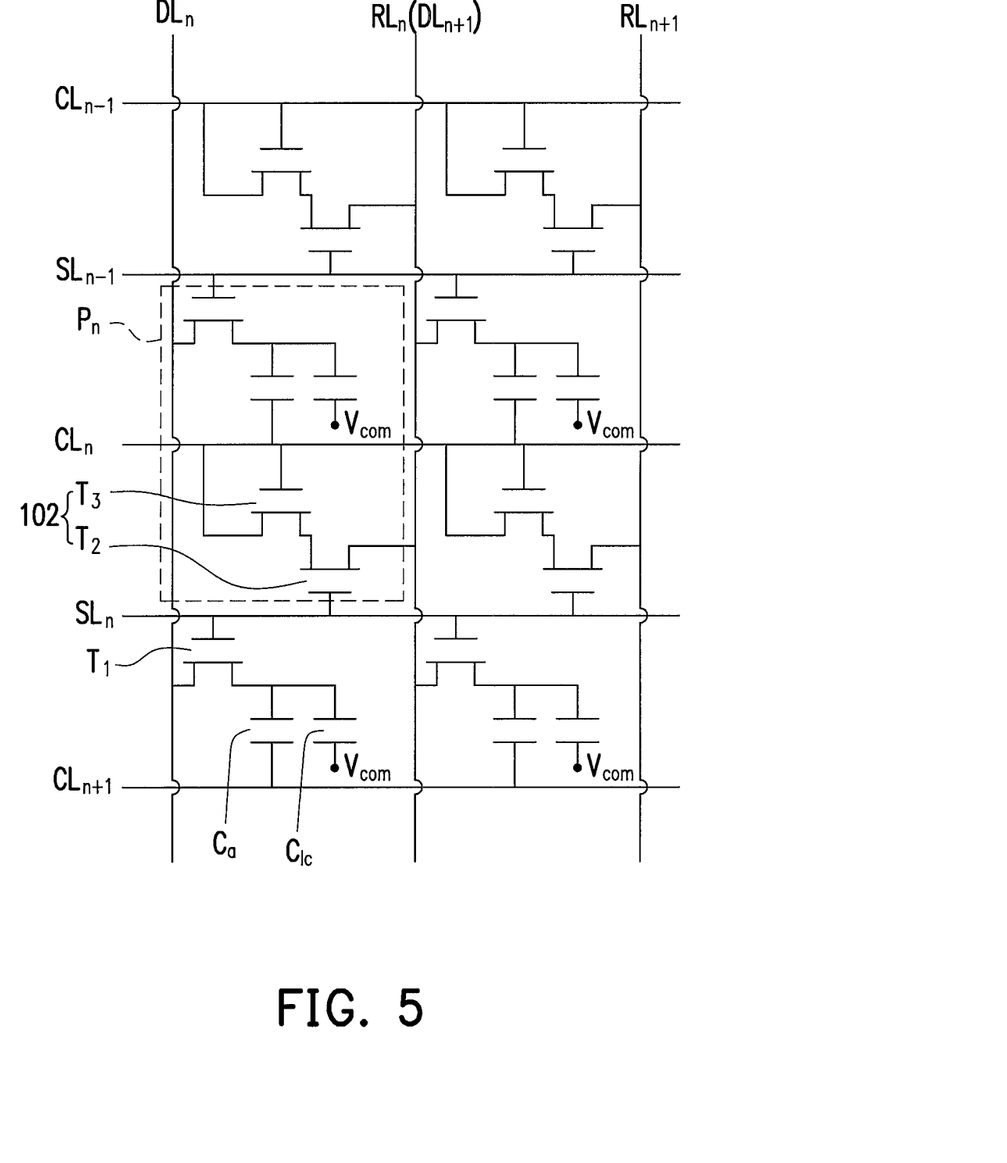
FIG. 5 shows an equivalent circuitry of a pixel structure according to an embodiment of the present invention.

After the first substrate 10, the second substrate 20 and the display medium 30 are assembled to form a display panel as shown in FIG. 4, a plurality of pixel units (as shown in FIG. 5) are formed, wherein each pixel unit corresponds to one of the pixel structures. In FIG. 5, an equivalent circuitry of pixel units of the display panel in FIG. 4 is shown. Referring to FIG. 5, in addition to the pixel structure $P_n$, a liquid crystal capacitor $C_{1c}$ is also formed in each pixel unit. The liquid crystal capacitor $C_{1c}$ is formed by the pixel electrode of the pixel structure $P_n$ on the first substrate 10 (as shown in FIG. 4), the electrode layer 22 on the second substrate 20 and the liquid crystal material 30 between the pixel structure $P_n$ and the electrode layer 22.

According to the embodiment, the electrode layer 22 on the second substrate 20 is electrically connected to a common voltage ($V_{com}$), such as a direct current voltage. The capacitor electrode lines ($CL_1, \ldots, CL_{n-1}, CL_n, CL_{n+1} \ldots$) are also electrically connect to this common voltage ($V_{com}$), such as the direct current voltage. Therefore, one end of the liquid crystal capacitor $C_{1c}$ of each pixel unit is electrically connected to the common voltage ($V_{com}$). Therefore, in the pixel structure $P_n$, the switch device $T_2$ and the active device $T_1$ are electrically connected to two adjacent scan line $SL_n$ and $SL_{n-1}$, respectively. That is to say, the active device $T_1$ and the sensing device 102 are electrically coupled with different capacitor electrode line $CL_{n+1}$ and $CL_n$ when sharing the common scan line $SL_n$.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel array comprising a plurality of pixel structures, each of the pixel structures comprising:
    two adjacent scan lines and two adjacent data lines surrounding the pixel structure, and disposed on a substrate;
    an active device, electrically connected to one of the scan line and a pixel electrode;
    a readout line, disposed above the data line;
    an electro-magnetic interference (EMI) shielding layer between the readout line and the data line and electrically connected to the pixel electrode;
    a sensing device, electrically connected to the readout line;
    a first insulating layer, disposed between the data line and the EMI shielding layer; and
    a second insulating layer, disposed between the EMI shielding layer and the readout line.

2. The pixel array as claimed in claim 1, further comprising a display medium disposed between the substrate and an opposite substrate.

3. The pixel array as claimed in claim 1, wherein the readout line and the pixel electrode are in the same layer.

4. The pixel array as claimed in claim 1, wherein the EMI shielding layer overlaps with the data line, and the readout line overlaps with the EMI shielding layer.

5. The pixel array as claimed in claim 1, wherein a material of the EMI shielding layer comprises a conductive material or a metal.

6. The pixel array as claimed in claim 1, wherein the active device comprises a gate electrically connected to the scan line, a source electrically connected to the data line and a drain electrically connected to the pixel electrode, the EMI shielding layer has a pattern profile the same to that of the source, the drain, and the data line.

7. The pixel array as claimed in claim 1, wherein the pixel structures further comprises a capacitor electrode line, electrically coupling with the pixel electrode.

8. The pixel array as claimed in claim 1, wherein the sensing device comprises:
    a switch device, electrically connected to the scan line and the readout line; and
    a photo sensor device, electrically connected to the switch device.

9. The pixel array as claimed in claim 1, wherein the sensing device is connected to the scan line which is not coupled with the active device.

10. A display panel, comprising:
    a first substrate, having a plurality of scan lines and a plurality of data lines disposed thereon, and comprising:
        a plurality of active devices disposed near the intersection of the scan line and the data line, and driven by the scan line;
        a pixel electrode, electrically connected to the active device;
        a readout line overlapped with the data line;
        an electro-magnetic interference (EMI) shielding layer between the readout line and the data line and electrically connected to the pixel electrode; and
        a sensing device, electrically connected to the readout line;
        a first insulating layer, disposed between the data line and the EMI shielding layer; and
        a second insulating layer, disposed between the EMI shielding layer and the readout line;
    a second substrate, opposite to the first substrate; and
    a display medium, disposed between the first substrate and the second substrate.

11. The display panel as claimed in claim 10, wherein the readout line and the data line are not fabricated by the same fabrication process.

12. The display panel as claimed in claim 10, wherein the readout line and the pixel electrode are in the same layer.

13. The display panel as claimed in claim 10, wherein the EMI shielding layer is over the data line, and the readout line is above the EMI shielding layer.

14. The display panel as claimed in claim 10, wherein a material of the EMI shielding layer comprises a conductive material or a metal.

15. The display panel as claimed in claim 10, wherein the active device comprises a gate electrically connected to the scan line, a source electrically connected to the data line and a drain electrically connected to the pixel electrode, the EMI shielding layer has a pattern profile the same to that of the source, the drain, and the data line.

16. The display panel as claimed in claim 10, wherein the readout line is over the data line and the EMI shielding layer.

17. The display panel as claimed in claim 10, wherein the sensing device comprises:
    a switch device, electrically connected to the scan line and the readout line; and
    a photo sensor device, electrically connected to the switch device.

* * * * *